(12) United States Patent
Nomura (10) Patent No.: US 9,559,701 B2
(45) Date of Patent: Jan. 31, 2017

(54) SENSOR SYSTEM, POWER FEEDING APPARATUS, AND SYNCHRONIZATION METHOD

(71) Applicant: Seiko Epson Corporation, Tokyo (JP)

(72) Inventor: Kazuo Nomura, Shiojiri (JP)

(73) Assignee: Seiko Epson Corporation (JP)

( * ) Notice: Subject to any disclaimer, the term of this patent is extended or adjusted under 35 U.S.C. 154(b) by 631 days.

(21) Appl. No.: 14/052,967

(22) Filed: Oct. 14, 2013

(65) Prior Publication Data

US 2014/0111004 A1 Apr. 24, 2014

(30) Foreign Application Priority Data

Oct. 24, 2012 (JP) ................................ 2012-234480

(51) Int. Cl.
| | | |
|---|---|---|
| *H02J 3/14* | (2006.01) | |
| *H03L 7/00* | (2006.01) | |
| *G01P 1/12* | (2006.01) | |
| *G01P 15/00* | (2006.01) | |

(52) U.S. Cl.
CPC ................ *H03L 7/00* (2013.01); *G01P 1/127* (2013.01); *G01P 15/00* (2013.01); *Y10T 307/25* (2015.04)

(58) Field of Classification Search
CPC .......... H03L 7/00; Y10T 307/25; G01P 15/00; G01P 1/127
USPC .......................................................... 307/38
See application file for complete search history.

(56) References Cited

U.S. PATENT DOCUMENTS

| | | | | |
|---|---|---|---|---|
| 5,111,410 A | * | 5/1992 | Nakayama | ........... A61B 5/1127 348/157 |
| 2004/0259651 A1 | * | 12/2004 | Storek | ............... A63B 69/3632 473/131 |
| 2012/0244807 A1 | * | 9/2012 | Kuroda | ................. H04W 74/06 455/41.2 |
| 2012/0322571 A1 | * | 12/2012 | Allen | ................ G09B 19/0038 473/266 |

FOREIGN PATENT DOCUMENTS

| | | | | |
|---|---|---|---|---|
| JP | 2006085503 | * | 9/2004 | ............... G06F 1/32 |
| JP | 2008-073210 A | | 4/2008 | |
| JP | 2008-271383 A | | 11/2008 | |
| JP | 2010-016576 A | | 1/2010 | |
| JP | 2011-055123 A | | 3/2011 | |
| JP | 2011-155957 A | | 8/2011 | |

OTHER PUBLICATIONS

Machine translation of JP 2006-085503; Sep. 2004.*

* cited by examiner

*Primary Examiner* — Jared Fureman
*Assistant Examiner* — Duc M Pham
(74) *Attorney, Agent, or Firm* — Harness, Dickey & Pierce, P.L.C.

(57) ABSTRACT

A power feeding apparatus includes a power feeding stop section that stops, all together, the supply of electric power to a plurality of sensors connected to the power feeding apparatus. Each of the sensors outputs a signal including timing information indicating the timing at which the supply of electric power is stopped by the power feeding stop section. A synchronization section synchronizes the output signals of the plurality of sensors based on the timing information.

9 Claims, 6 Drawing Sheets

SENSOR UNIT SIGNAL 10AS

| No. | COUNT INFORMATION | TIME INFORMATION | GYRO SENSOR | | | ACCELERATION SENSOR | | |
|---|---|---|---|---|---|---|---|---|
| | | | x | y | z | x | y | z |
| 1 | | AT0 | Agx0 | Agy0 | Agz0 | Aax0 | Aay0 | Aaz0 |
| 2 | 0 | AT1 | Agx1 | Agy1 | Agz1 | Aax1 | Aay1 | Aaz1 |
| 3 | 1 | AT2 | Agx2 | Agy2 | Agz2 | Aax2 | Aay2 | Aaz2 |
| 4 | 2 | AT3 | Agx3 | Agy3 | Agz3 | Aax3 | Aay3 | Aaz3 |

FIG. 4A

SENSOR UNIT SIGNAL 10BS

| No. | COUNT INFORMATION | TIME INFORMATION | GYRO SENSOR | | | ACCELERATION SENSOR | | |
|---|---|---|---|---|---|---|---|---|
| | | | x | y | z | x | y | z |
| 1 | | BT0 | Bgx0 | Bgy0 | Bgz0 | Bax0 | Bay0 | Baz0 |
| 2 | | BT1 | Bgx1 | Bgy1 | Bgz1 | Bax1 | Bay1 | Baz1 |
| 3 | 0 | BT2 | Bgx2 | Bgy2 | Bgz2 | Bax2 | Bay2 | Baz2 |
| 4 | 1 | BT3 | Bgx3 | Bgy3 | Bgz3 | Bax3 | Bay3 | Baz3 |

FIG. 4B

SENSOR UNIT SIGNAL 10AS

| No. | TIME INFORMATION (ELAPSED TIME) | GYRO SENSOR | | | ACCELERATION SENSOR | | |
|---|---|---|---|---|---|---|---|
| | | x | y | z | x | y | z |
| 1 | 000010 | Agx0 | Agy0 | Agz0 | Aax0 | Aay0 | Aaz0 |
| 2 | 000000 | Agx1 | Agy1 | Agz1 | Aax1 | Aay1 | Aaz1 |
| 3 | 000001 | Agx2 | Agy2 | Agz2 | Aax2 | Aay2 | Aaz2 |
| 4 | 000002 | Agx3 | Agy3 | Agz3 | Aax3 | Aay3 | Aaz3 |

FIG. 5A

SENSOR UNIT SIGNAL 10BS

| No. | TIME INFORMATION (ELAPSED TIME) | GYRO SENSOR | | | ACCELERATION SENSOR | | |
|---|---|---|---|---|---|---|---|
| | | x | y | z | x | y | z |
| 1 | 000020 | Bgx0 | Bgy0 | Bgz0 | Bax0 | Bay0 | Baz0 |
| 2 | 000021 | Bgx1 | Bgy1 | Bgz1 | Bax1 | Bay1 | Baz1 |
| 3 | 000000 | Bgx2 | Bgy2 | Bgz2 | Bax2 | Bay2 | Baz2 |
| 4 | 000001 | Bgx3 | Bgy3 | Bgz3 | Bax3 | Bay3 | Baz3 |

FIG. 5B

SENSOR UNIT SIGNAL 10AS

| No. | TIME INFORMATION | GYRO SENSOR | | | ACCELERATION SENSOR | | |
|---|---|---|---|---|---|---|---|
| | | x | y | z | x | y | z |
| 1 | AT0 | Agx0 | Agy0 | Agz0 | Aax0 | Aay0 | Aaz0 |
| 2 | AT1 | Agx0 | Agy1 | Agz1 | Aax1 | Aay1 | Aaz1 |
| 3 | AT2 | Agx2 | Agy2 | Agz2 | Aax2 | Aay2 | Aaz2 |
| 4 | AT3 | Agx3 | Agy3 | Agz3 | Aax3 | Aay3 | Aaz3 |
| n | AT1 | | | | | | |

FIG. 6A

SENSOR UNIT SIGNAL 10BS

| No. | TIME INFORMATION | GYRO SENSOR | | | ACCELERATION SENSOR | | |
|---|---|---|---|---|---|---|---|
| | | x | y | z | x | y | z |
| 1 | BT0 | Bgx0 | Bgy0 | Bgz0 | Bax0 | Bay0 | Baz0 |
| 2 | BT1 | Bgx1 | Bgy1 | Bgz1 | Bax1 | Bay1 | Baz1 |
| 3 | BT2 | Bgx2 | Bgy2 | Bgz2 | Bax2 | Bay2 | Baz2 |
| 4 | BT3 | Bgx3 | Bgy3 | Bgz3 | Bax3 | Bay3 | Baz3 |
| n | BT2 | | | | | | |

FIG. 6B

SENSOR SYSTEM, POWER FEEDING APPARATUS, AND SYNCHRONIZATION METHOD

BACKGROUND

1. Technical Field

The present invention relates to a sensor system, a power feeding apparatus, and a synchronization method in the sensor system.

2. Related Art

As a technique for evaluating object motion such as a golf swing, an image taken by a camera has limited analysis information. In that regard, it is proposed to dispose a plurality of sensors such as acceleration sensors and gyro sensors on a golf club to perform swing analysis, as disclosed in JP-A-2008-73210 for example.

When analyzing object motion, a plurality of sensors are attached to an object. In JP-A-2008-73210, a gyro sensor and an acceleration sensor are attached to a shaft portion of a golf club, and a gyro sensor and an acceleration sensor are also attached to a head portion.

For analyzing object motion based on outputs from the plurality of sensors attached to the object in this manner, the outputs from the plurality of sensors need to be time synchronized. This is because information at the same time or at the same position of the object needs to be acquired from the plurality of sensors. In doing so, when, for example, a synchronizing signal is time-sequentially transmitted from a host terminal to the plurality of sensors, the outputs from the plurality of sensors cannot be time synchronized precisely because the timing of receiving the synchronizing signal varies among the plurality of sensors.

SUMMARY

An advantage of some aspects of the invention is to solve at least a part of the problem described above, and the invention can be implemented as the following forms or application examples.

APPLICATION EXAMPLE 1

This application example is directed to a sensor system including: a power feeding section that supplies electric power to a plurality of sensors; and a synchronization section that synchronizes output signals of the plurality of sensors, wherein the power feeding section includes a power feeding stop part that stops the supply of electric power to the plurality of sensors, and the synchronization section receives, from the plurality of sensors, timing information indicating when the supply of electric power is stopped by the power feeding stop part, and synchronizes the plurality of sensors using the timing information.

According to the sensor system, the power feeding stop part of the power feeding section stops the supply of electric power to the plurality of sensors all together. Each of the sensors in which the supply of electric power is stopped outputs a signal including the timing information indicating the timing at which the supply of electric power is stopped. Then, the synchronization section synchronizes the signals from the sensors based on the timing information output from each of the sensors. The timing information output from each of the sensors indicates the timing at which the supply of electric power to the sensors is stopped all together. Hence, the timing information output from each of the sensors indicates the timing common to the sensors. Due to this, in the synchronization section, the signals output from the sensors can be time synchronized precisely based on the timing information indicating the timing common to the sensors.

APPLICATION EXAMPLE 2

This application example is directed to the sensor system described above, wherein the timing information includes count information that is counted up according to the output signal of the sensor.

APPLICATION EXAMPLE 3

This application example is directed to the sensor system described above, wherein an initial value is set in the count information when the supply of electric power is stopped by the power feeding stop part, and the synchronization section synchronizes the output signals of the plurality of sensors using the initial value of the count information.

According to the sensor system, each of the sensors in which the supply of electric power is stopped includes, as timing information indicating the timing at which the supply of electric power is stopped, the count information in which the initial value is set in a signal, and outputs the signal. Then, the synchronization section synchronizes the signals from the sensors based on the initial value of the count information output from each of the sensors. The initial value of the count information output from each of the sensors indicates the timing at which the supply of electric power to the sensors is stopped all together. Hence, the initial value of the count information output from each of the sensors indicates the timing common to the sensors. Due to this, in the synchronization section, the signals output from the sensors can be time synchronized precisely based on the initial value of the count information indicating the timing common to the sensors.

APPLICATION EXAMPLE 4

This application example is directed to the sensor system described above, wherein the timing information includes time information.

APPLICATION EXAMPLE 5

This application example is directed to the sensor system described above, wherein an initial value is set in the time information when the supply of electric power to the plurality of sensors is stopped by the power feeding stop part, and the synchronization section synchronizes the output signals of the plurality of sensors using the initial value of the time information.

According to the sensor system, each of the sensors in which the supply of electric power is stopped includes, as timing information indicating the timing at which the supply of electric power is stopped, the time information in which the initial value is set in a signal, and outputs the signal. Then, the synchronization section synchronizes the signals from the sensors based on the initial value of the time information output from each of the sensors. The initial value of the time information output from each of the sensors indicates the timing at which the supply of electric power to the sensors is stopped all together. Hence, the initial value of the time information output from each of the sensors indicates the timing common to the sensors. Due to this, in the synchronization section, the signals output from the sensors can be time synchronized precisely based on the initial value of the time information indicating the timing common to the sensors.

APPLICATION EXAMPLE 6

This application example is directed to the sensor system described above, wherein the synchronization section synchronizes the output signals of the plurality of sensors using the time information indicating when the supply of electric power to the plurality of sensors is stopped by the power feeding stop part.

According to the sensor system, each of the sensors in which the supply of electric power is stopped includes, as timing information indicating the timing at which the supply of electric power is stopped, the timing information having a time at the sensor when the supply of electric power is stopped in a signal, and outputs the signal. Then, the synchronization section synchronizes the signals from the sensors based on the timing information having the time and output from the sensors. The timing information having the time and output from each of the sensors indicates the timing at which the supply of electric power to the sensors is stopped all together. Hence, the timing information having the time and output from each of the sensors indicates the timing common to the sensors. Due to this, in the synchronization section, the signals output from the sensors can be time synchronized precisely based on the timing information having the time and indicating the timing common to the sensors.

APPLICATION EXAMPLE 7

This application example is directed to the sensor system described above, wherein the power feeding stop part is a switch that switches between the starting of power feeding and the stopping of power feeding.

According to the sensor system, when the power feeding stop part is made into the form of a switch, it is possible to easily switch between the starting of power feeding and the stopping of power feeding.

APPLICATION EXAMPLE 8

This application example is directed to a power feeding apparatus including a power feeding section that supplies electric power to a plurality of sensors, wherein the power feeding section includes a power feeding stop part stopping the supply of electric power to the plurality of sensors, receives, from the plurality of sensors, timing information indicating when the supply of electric power is stopped by the power feeding stop part, and transmits the timing information to a synchronization section.

According to the power feeding apparatus, the power feeding stop part of the power feeding section stops the supply of electric power to the plurality of sensors all together. Each of the sensors in which the supply of electric power is stopped outputs a signal including the timing information indicating the timing at which the supply of electric power is stopped. Then, the synchronization section synchronizes the signals from the sensors based on the timing information output from each of the sensors. The timing information output from each of the sensors indicates the timing at which the supply of electric power to the sensors is stopped all together. Hence, the timing information output from each of the sensors indicates the timing common to the sensors. Due to this, in the synchronization section, the signals output from the sensors can be time synchronized precisely based on the timing information indicating the timing common to the sensors.

APPLICATION EXAMPLE 9

This application example is directed to a synchronization method including: supplying electric power to a plurality of sensors; and synchronizing the plurality of sensors using timing information indicating when the supply of electric power to the plurality of sensors is stopped.

According to the synchronization method, signals output from the sensors are synchronized based on the timing information output from each of the sensors. The timing information output from each of the sensors indicates the timing at which the supply of electric power to the sensors is stopped all together. Hence, the timing information output from each of the sensors indicates the timing common to the sensors. Due to this, the signals output from the sensors can be time synchronized precisely based on the timing information indicating the timing common to the sensors.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. The embodiments described below do not unduly limit the contents of the invention set forth in the appended claims, and not all of the configurations described in the embodiments may necessarily be indispensable as solving means of the invention. Although, in the following, a motion analysis system will be described as an example of a sensor system of the invention, the invention can be applied to any systems other than the motion analysis system.

First Embodiment

Hereinafter, a motion analysis system according to a first embodiment will be described with reference to the drawings.

Outline of Motion Analysis System

Figure 1A:
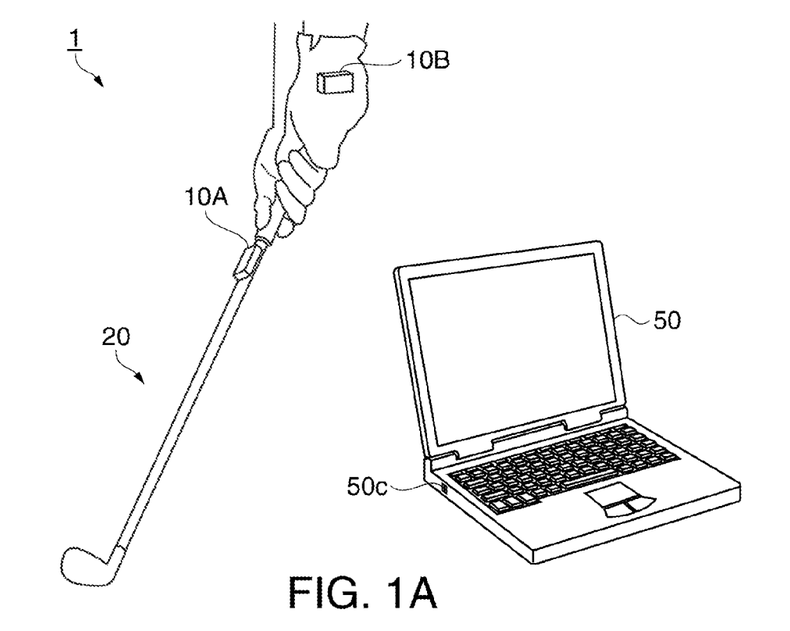
FIGS. 1A and 1B show the outline of a motion analysis system.
Figure 1B:
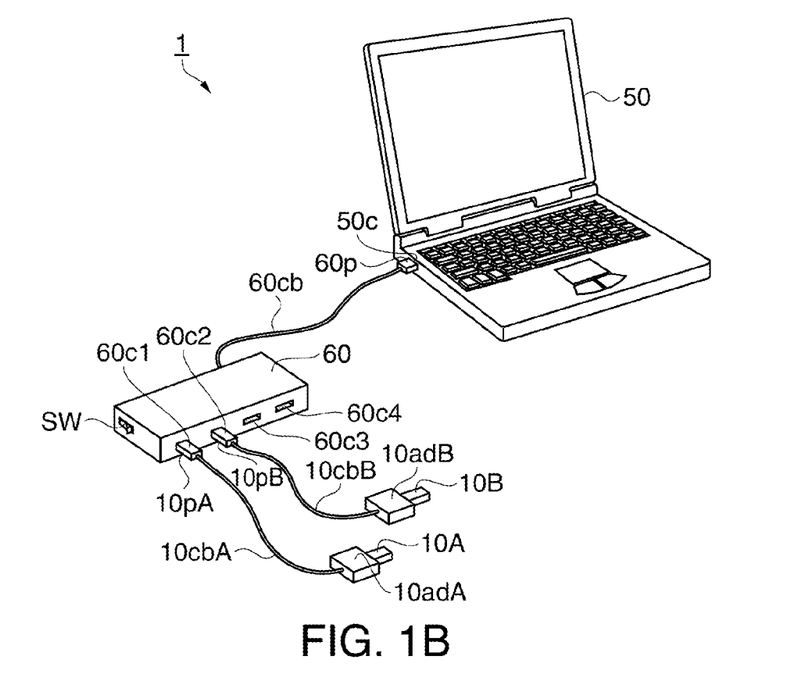

First, the outline of the motion analysis system will be described. FIGS. 1A and 1B are diagrams showing the outline of the motion analysis system according to the embodiment. FIG. 1A shows an example of a motion analysis system 1 that relates to a golf swing and analyzes a swing action of a golf club. FIG. 1B shows an example of a power feeding apparatus 60 that charges a sensor unit 10A and a sensor unit 10B in FIG. 1A. As shown in FIGS. 1A and 1B, the motion analysis system 1 is configured to include the sensor units 10A and 10B, a host terminal 50, and the power feeding apparatus 60.

In FIG. 1A, the sensor unit 10A is attached to, for example, a shaft of a golf club 20 at a position close to a grip of the golf club. The sensor unit 10B is attached to, for example, the back of the user's hand via a glove. The host terminal 50 is, for example, a personal computer or a dedicated device, and includes a connector 50c for mounting a USB device. Into each of the sensor units 10A and 10B, two types of inertial sensors, an acceleration sensor and a gyro sensor for example, are incorporated.

The power feeding apparatus 60 shown in FIG. 1B is, for example, a USB hub having four downstream connectors 60c1 to 60c4. In FIG. 1B, a plug 60p of a cable 60cb connected to the power feeding apparatus 60 is mounted in the connector 50c of the host terminal 50, so that the power feeding apparatus 60 and the host terminal 50 are in a connected state.

The sensor units 10A and 10B are mounted in adapters 10adA and 10adB, respectively. A plug 10pA of a cable 10cbA from the adapter 10adA is mounted in the connector 60c1 of the power feeding apparatus 60, so that the sensor unit 10A and the power feeding apparatus 60 are in the connected state. Further, a plug 10pB of a cable 10cbB from the adapter 10adB is mounted in the connector 60c2 of the power feeding apparatus 60, so that the sensor unit 10B and the power feeding apparatus 60 are in the connected state. That is, the sensor units 10A and 10B are in a state of being charged from the host terminal 50 via the power feeding apparatus 60.

The power feeding apparatus 60 is disposed with a switch SW for stopping power feeding to USB devices mounted in the connectors 60c1 to 60c4 all together. The power feeding apparatus 60 may draw power, not from the host terminal 50, but from an outlet through an AC adapter, a battery, a battery pack, or the like.

Configuration of Motion Analysis System

Figure 2:
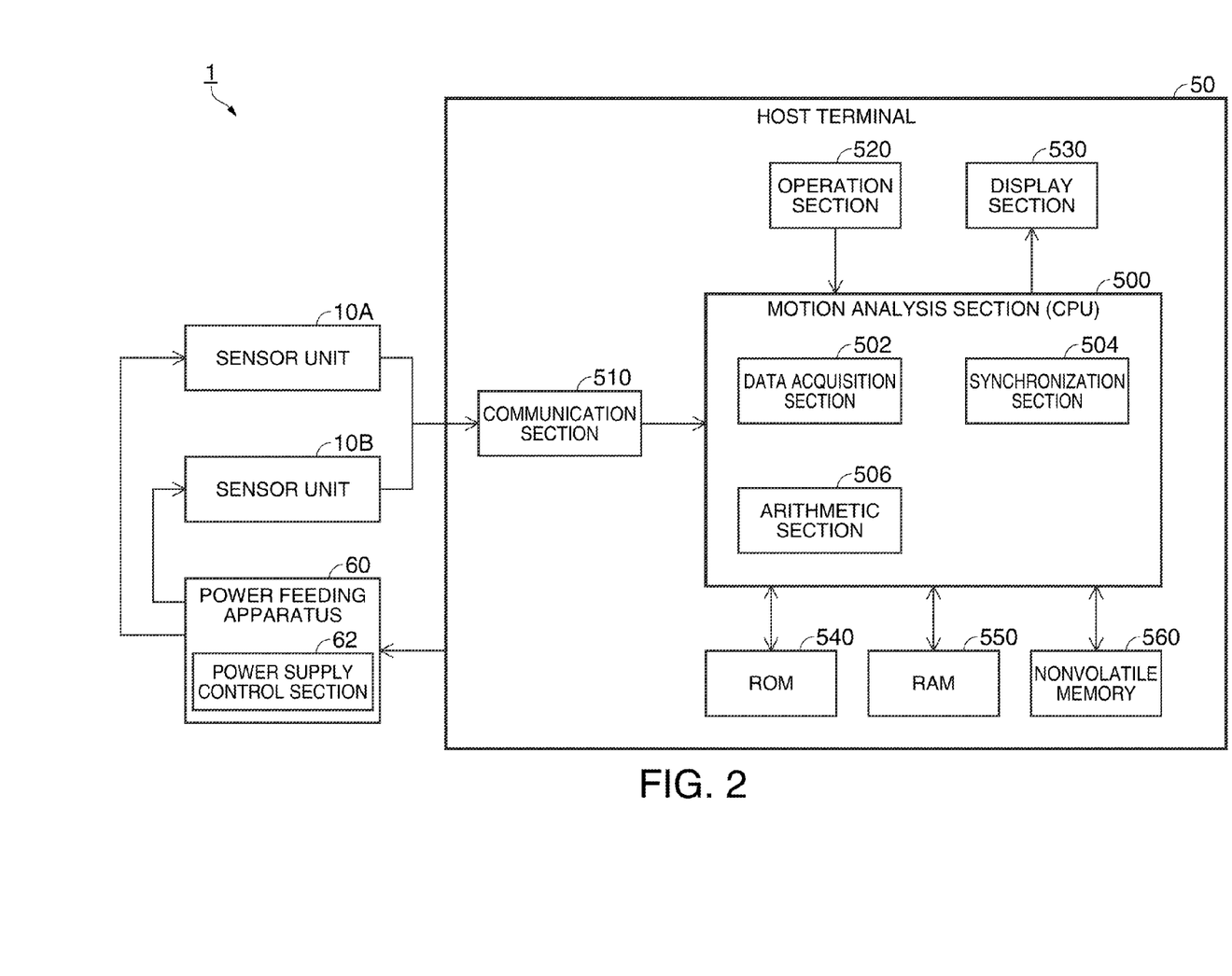
FIG. 2 is a block diagram showing the configuration of the motion analysis system.

Next, the configuration of the motion analysis system 1 will be described. FIG. 2 is a block diagram showing the configuration of the motion analysis system 1. As described above, the motion analysis system 1 is configured to include the sensor units 10A and 10B, the host terminal 50, and the power feeding apparatus 60.

The host terminal 50 includes a communication section 510, an operation section 520, a display section 530, a ROM 540, a RAM 550, a nonvolatile memory 560, and a motion analysis section 500.

The communication section 510 performs processing of receiving signal data transmitted from the sensor units 10A and 10B, and sending the signal data to the motion analysis section 500.

The operation section 520 performs processing of acquiring operation data from the user, and sending the operation data to the motion analysis section 500. The operation section 520 is, for example, a touch panel display, a button, a key, a microphone, or the like.

The display section 530 displays a processing result in the motion analysis section 500 as a character, a graph, or other images. The display section 530 is, for example, a CRT, an LCD, a touch panel display, an HMD (head-mounted display), or the like. For example, both functions of the operation section 520 and the display section 530 may be realized by one touch panel display.

The ROM 540 is a storage section that stores programs for the motion analysis section 500 to perform various types of calculation processing or control processing and various types of programs, data, or the like to realize application functions.

The RAM 550 is used as a working area of the motion analysis section 500, and is a storage section that temporarily stores the program or data read from the ROM 540 or the like, the data acquired in the operation section 520, and an arithmetic result or the like executed by the motion analysis section 500 according to the various types of programs.

The nonvolatile memory 560 is a recording section that records data needing to be stored for a long time among data generated by the motion analysis section 500 through processing.

The motion analysis section 500 performs various types of processing according to the programs stored in the ROM 540. The motion analysis section 500 can be realized by a microprocessor such as a CPU. The motion analysis section 500 includes a data acquisition section 502, a synchronization section 504, and an arithmetic section 506.

The data acquisition section 502 performs processing of acquiring signal data received from the sensor units 10A and 10B via the communication section 510. The acquired signal data is stored in, for example, the RAM 550.

The synchronization section 504 synchronizes the signal data from the sensor unit 10A (hereinafter referred to as "sensor unit signal 10AS") with the signal data from the sensor unit 10B (hereinafter referred to as "sensor unit signal 10BS") where the both signal data are acquired time-sequentially in the data acquisition section 502. The synchronization of the sensor unit signals 10AS and 10BS will be described in detail.

The arithmetic section 506 analyzes, based on the synchronized sensor unit signals 10AS and 10BS, motions of the respective portions to which the sensor units 10A and 10B are attached. In the embodiment, based on the sensor unit signals 10AS and 10BS, acceleration and angular velocity are obtained at each of moved positions of the shaft of the golf club 20 associated with the user's golf swing and at each of moved positions of the back of the user's hand. By first-order time integrating the data from the acceleration sensor at the moved positions, or by first-order differentiating the data at the moved positions, the speed at each of the moved positions can be obtained.

The power feeding apparatus 60 connected to the host terminal 50 includes a power supply control section 62.

The power supply control section 62 receives the supply of electric power from the host terminal 50 when the power feeding apparatus 60 is connected to the host terminal 50. In the state of receiving the supply of electric power from the host terminal 50, the power supply control section 62 feeds power to the sensor units 10A and 10B connected to the power feeding apparatus 60. Moreover, when the plug 60p from the power feeding apparatus 60 is pulled out of the connector 50c of the host terminal 50, or when the switch SW is switched from "on" to "off" (refer to FIG. 1B), the power supply control section 62 simultaneously stops, as a power feeding stop section, power feeding to the sensor units 10A and 10B in terms of hardware.

Configuration of Sensor Unit

Next, the configuration of the sensor units 10A and 10B will be described.

Figure 3:
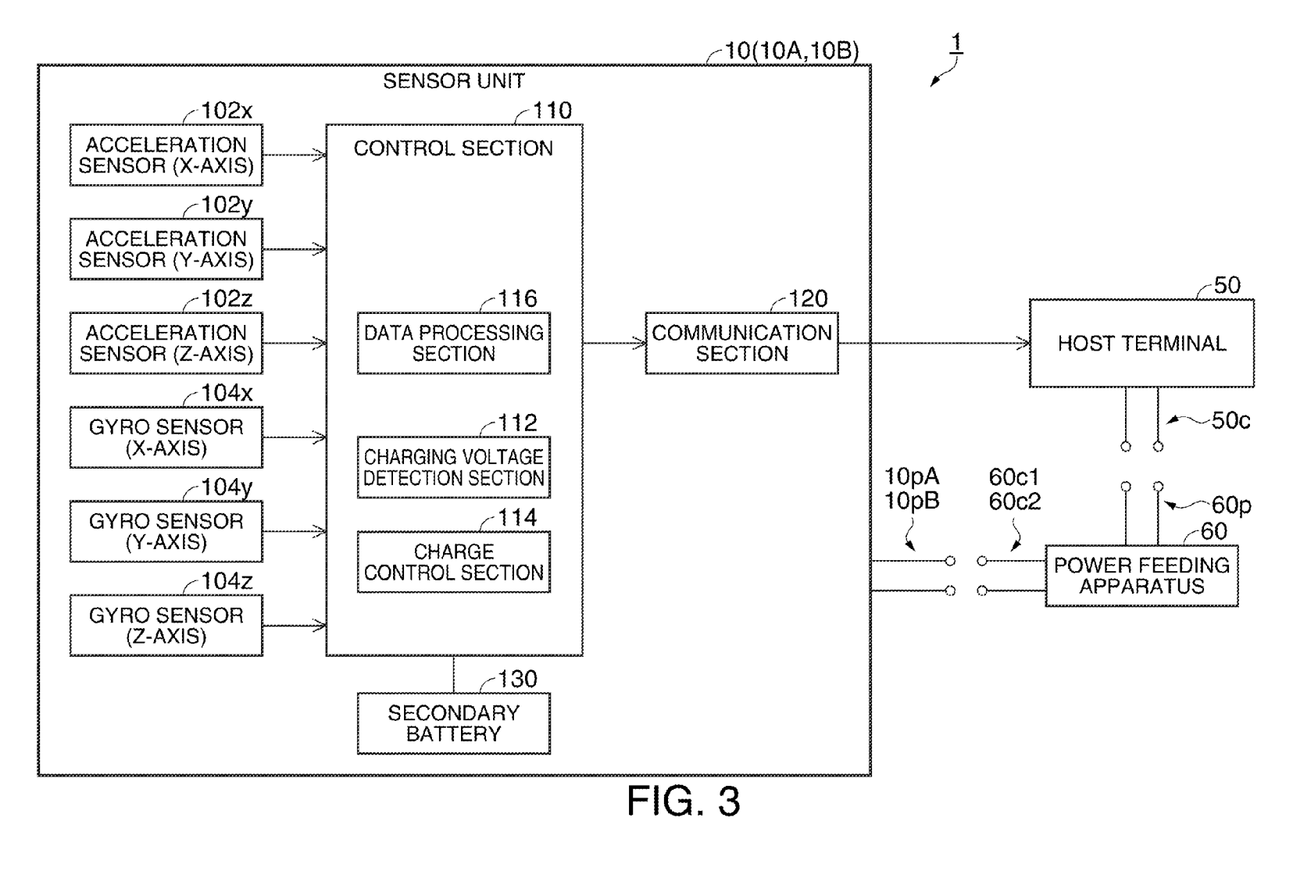
FIG. 3 is a block diagram showing the configuration of a sensor unit.

FIG. 3 is a block diagram showing the configuration of the sensor units 10A and 10B. As shown in FIG. 3, the sensor unit 10 includes acceleration sensors 102x, 102y, and 102z, gyro sensors 104x, 104y, and 104z, a control section 110, a communication section 120, and a secondary battery 130.

The acceleration sensors $102x$, $102y$, and $102z$ can detect accelerations in directions of orthogonal three axes (x, y, and z), respectively. The gyro sensors $104x$, $104y$, and $104z$ can detect angular velocities about the orthogonal three axes (x, y, and z), respectively.

The control section 110 includes a charging voltage detection section 112, a charge control section 114, and a data processing section 116.

The charging voltage detection section 112 detects a charging voltage to the secondary battery 130 when a terminal of the plug $60p$ from the power feeding apparatus 60 and a terminal of the connector $50c$ of the host terminal 50 are in the connected state and further, terminals of the connectors $60c1$ and $60c2$ of the power feeding apparatus 60 and terminals of the plugs $10pA$ and $10pB$ from the sensor unit 10 are respectively in the connected state.

The charge control section 114 controls charging to the secondary battery 130 based on the detected result of the charging voltage in the charging voltage detection section 112.

The data processing section 116 outputs, as the sensor unit signals 10AS and 10BS, output signals from the acceleration sensors $102x$ to $102z$ and the gyro sensors $104x$ to $104z$ in packets together with time information and count information as timing information to the communication section 120.

Moreover, at the time point when the charging voltage to the secondary battery 130 is no longer detected by the charging voltage detection section 112, that is, at the time point when power feeding to the sensor units 10A and 10B is stopped all together, the data processing section 116 clears count information of each of the sensor unit signals 10AS and 10BS to 0 (an initial value is set) to start counting.

Figure 4A:
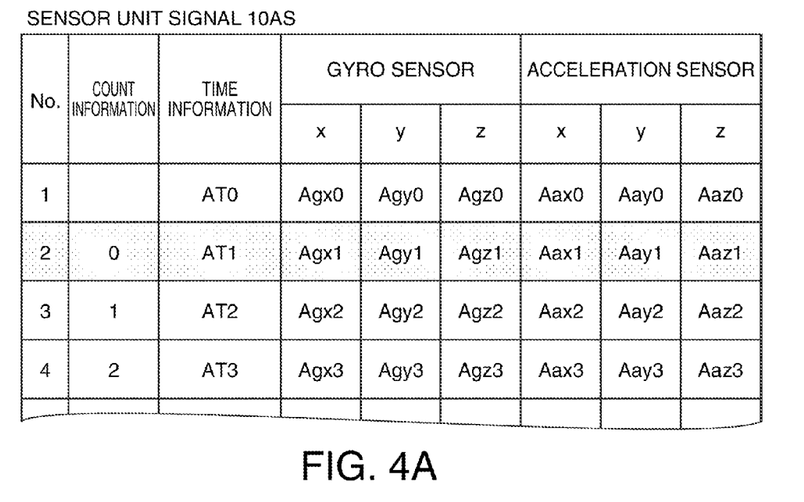
FIGS. 4A and 4B are examples of sensor unit signals to be transmitted to a host terminal in a first embodiment.
Figure 4B:
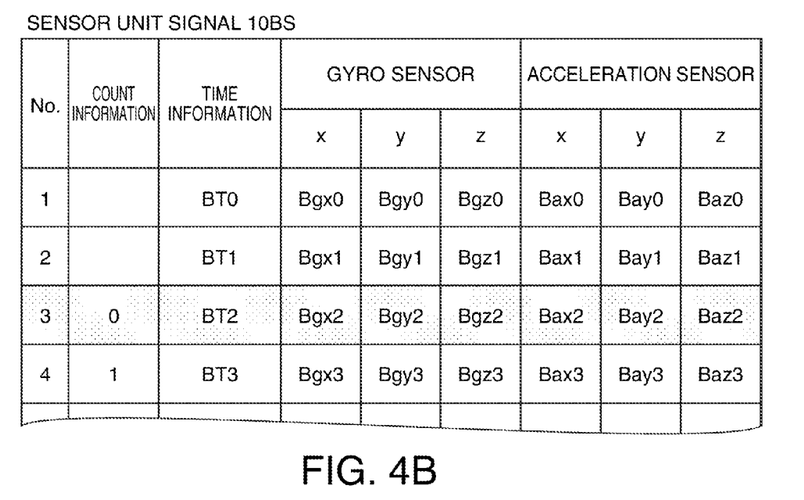

FIG. 4A shows an example of the sensor unit signal 10AS to be transmitted to the host terminal 50 via the communication section 120 of the sensor unit 10A. FIG. 4B shows an example of the sensor unit signal 10BS to be transmitted to the host terminal 50 via the communication section 120 of the sensor unit 10B.

In FIG. 4A, No. 2 (shaded area) in the sensor unit signal 10AS and No. 3 (shaded area) in the sensor unit signal 10BS show the time point when power feeding to the sensor units 10A and 10B is stopped all together. Then, as shown in FIG. 4A, the data processing section 116 of the sensor unit 10A sets "0" in No. 2 count information in the sensor unit signal 10AS. At the same time, as shown FIG. 4B, the data processing section 116 of the sensor unit 10B sets "0" in No. 3 count information in the sensor unit signal 10BS. In subsequent signal data in the sensor unit signals 10AS and 10BS, a counted-up value is set in count information.

On the other hand, the synchronization section 504 (refer to FIG. 2) of the host terminal 50 can synchronize the sensor unit signal 10AS with the sensor unit signal 10BS using the count information of the sensor unit signal 10AS from the sensor unit 10A and the count information of the sensor unit signal 10BS from the sensor unit 10B. In the case of examples of FIGS. 4A and 4B, it can be determined that the No. 2 count information "0" of the sensor unit signal 10AS and the No. 3 count information "0" of the sensor unit signal 10BS coincide with each other on a time axis. With reference to the sensor unit signals 10AS and 10BS that coincide with each other on the time axis as described above, it is also possible to synchronize subsequent sensor unit signals 10AS and 10BS with each other.

Referring back to FIG. 3, the control section 110 further performs processing of a bias correction or temperature correction of the acceleration sensors $102x$ to $102z$ and the gyro sensors $104x$ to $104z$. The function of bias correction or temperature correction may be incorporated into each of the acceleration sensors $102x$ to $102z$ or each of the gyro sensors $104x$ to $104z$.

The communication section 120 transmits, as signal data, packet data received from the data processing section 116 to the host terminal 50. The communication section 120 of each of the sensor units 10A and 10B and the communication section 510 (refer to FIG. 2) of the host terminal 50 are wirelessly connected to each other using, preferably, the Bluetooth standard or the like. The connection between the sensor units 10A and 10B and the host terminal 50 is not limited to the wireless connection, but a wired connection may be used depending on the types of the objects to which the sensor units 10A and 10B are attached.

In the embodiment described above, at the time point when, for example, charging from the power feeding apparatus 60 to the sensor units 10A and 10B is finished, and the user pulls the plug $60p$ out of the host terminal 50 or turns "off" the switch SW, count information to be transmitted from the sensor units 10A and 10B is cleared to 0 all together. In the host terminal 50, by receiving the count information that has been cleared to 0, signal data from the sensor units 10A and 10B can be synchronized with each other. As a result, it is possible to eliminate problems such as out-of-time synchronization occurring when a synchronizing signal is transmitted time-sequentially from the host terminal 50, a transmitting apparatus, or the like to the sensor units 10A and 10B, so that signal data can be time synchronized precisely with each other. Moreover, since the sensor units 10A and 10B deal with synchronization by simply clearing the count information to 0 at the time point when power feeding from the power feeding apparatus 60 is stopped, the time synchronization can be easily realized without the need of complicated processing.

Second Embodiment

Hereinafter, a motion analysis system according to a second embodiment will be described.

The motion analysis system according to the second embodiment has substantially the same configuration as that of the motion analysis system 1 according to the first embodiment, but differs from the motion analysis system 1 according to the first embodiment in processing in the data processing sections 116 (refer to FIG. 3) of the sensor units 10A and 10B and processing in the synchronization section 504 (refer to FIG. 2) of the host terminal 50.

In the second embodiment, at the time point when the charging voltage to the secondary battery 130 is no longer detected by the charging voltage detection section 112, that is, at the time point when power feeding to the sensor units 10A and 10B is stopped all together, the data processing sections 116 of the sensor units 10A and 10B clear time information of the sensor unit signals 10AS and 10BS to 0 (an initial value is set).

Figure 5A:
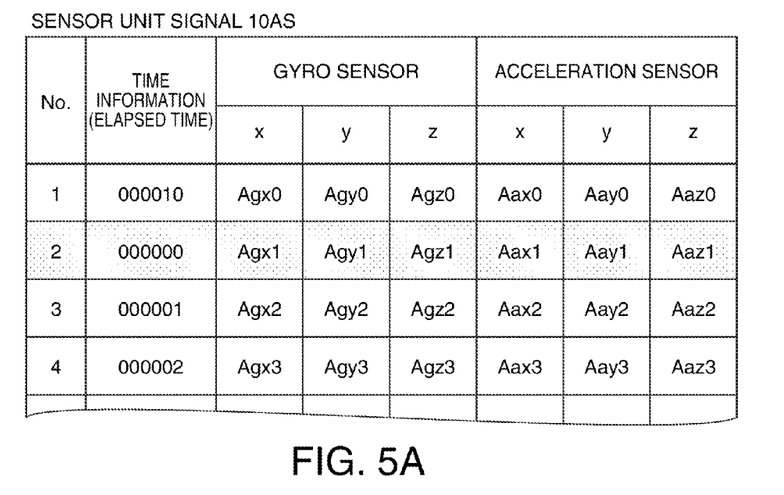
FIGS. 5A and 5B are examples of sensor unit signals to be transmitted to the host terminal in a second embodiment.
Figure 5B:
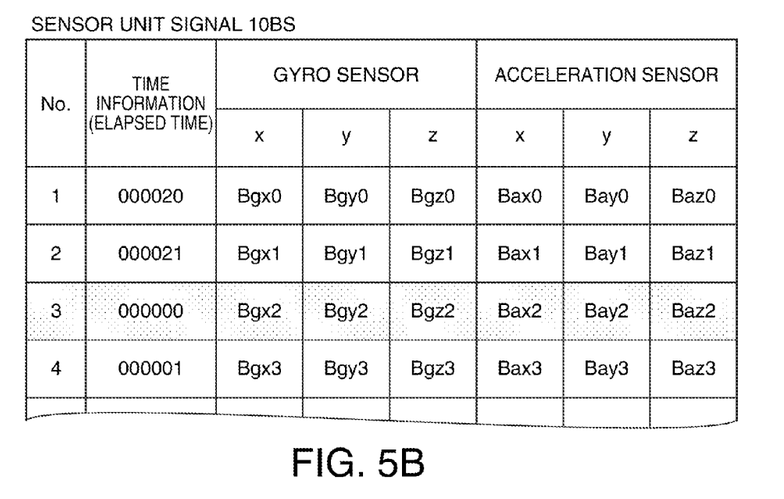

FIG. 5A shows an example of the sensor unit signal 10AS to be transmitted to the host terminal 50 via the communication section 120 of the sensor unit 10A in the second embodiment. FIG. 5B shows an example of the sensor unit signal 10BS to be transmitted to the host terminal 50 via the communication section 120 of the sensor unit 10B in the second embodiment. As shown in FIGS. 5A and 5B, the sensor unit signals 10AS and 10BS of the second embodiment do not include count information as timing information, which is different from the first embodiment. Time information of each of the sensor unit signals 10AS and 10BS is an elapsed time, which serves also timing information.

In FIG. 5A, No. 2 (shaded area) in the sensor unit signal 10AS and No. 3 (shaded area) in the sensor unit signal 10BS show the time point when power feeding to the sensor units 10A and 10B is stopped all together. Then, as shown in FIG. 5A, the data processing section 116 of the sensor unit 10A clears No. 2 time information (elapsed time) in the sensor unit signal 10AS to 0. At the same time, as shown in FIG. 5B, the data processing section 116 of the sensor unit 10B clears No. 3 time information (elapsed time) in the sensor unit signal 10BS to 0. In subsequent signal data of the sensor unit signal 10AS, an elapsed time with the No. 2 time information (elapsed time) as a starting point is set in time information (elapsed time). In subsequent signal data of the sensor unit signal 10BS, an elapsed time with the No. 3 time information (elapsed time) as a starting point is set in time information (elapsed time).

On the other hand, the synchronization section 504 (refer to FIG. 2) of the second embodiment of the host terminal 50 can synchronize the sensor unit signal 10AS with the sensor unit signal 10BS using the time information (elapsed time) of the sensor unit signal 10AS from the sensor unit 10A and the time information (elapsed time) of the sensor unit signal 10BS from the sensor unit 10B. In the case of examples of FIGS. 5A and 5B, it can be determined that the No. 2 time information (elapsed time) "000000" of the sensor unit signal 10AS and the No. 3 time information (elapsed time) "000000" of the sensor unit signal 10BS coincide with each other on the time axis. With reference to the sensor unit signals 10AS and 10BS that coincide with each other on the time axis as described above, it is also possible to synchronize subsequent sensor unit signals 10AS and 10BS with each other.

In the embodiment described above, at the time point when power feeding from the power feeding apparatus 60 is stopped, time information to be transmitted from the sensor units 10A and 10B is cleared to 0 all together. In the host terminal 50, by receiving the time information that has been cleared to 0, the respective signal data of the sensor units 10A and 10B can be synchronized with each other. The time information to be transmitted from the sensor units 10A and 10B is used also as timing information in this manner, whereby time synchronization can be dealt with further easily without adding information for synchronization to the signal data.

Third Embodiment

Hereinafter, a motion analysis system according to a third embodiment will be described.

The motion analysis system according to the third embodiment has substantially the same configuration as that of the motion analysis system 1 according to the first embodiment, but differs from the motion analysis systems according to the first and second embodiments in processing in the data processing sections 116 (refer to FIG. 3) of the sensor units 10A and 10B and processing in the synchronization section 504 (refer to FIG. 2) of the host terminal 50.

In the third embodiment, at the time point when charging voltage to the secondary battery 130 is no longer detected by the charging voltage detection section 112, that is, at the time point when power feeding to the sensor units 10A and 10B is stopped all together, the data processing section 116 of the sensor unit 10A stores the time at the sensor unit 10A in a memory (not shown) in the sensor unit 10A while the data processing section 116 of the sensor unit 10B stores the time at the sensor unit 10B in a memory (not shown) in the sensor unit 10B. Then, the data processing section 116 of the sensor unit 10A sets the time stored in the memory as timing information, and transmits the timing information to the host terminal 50 as a last sensor unit signal 10AS. The data processing section 116 of the sensor unit 10B sets the time stored in the memory as timing information, and transmits the timing information to the host terminal 50 as a last sensor unit signal 10BS.

Figure 6A:
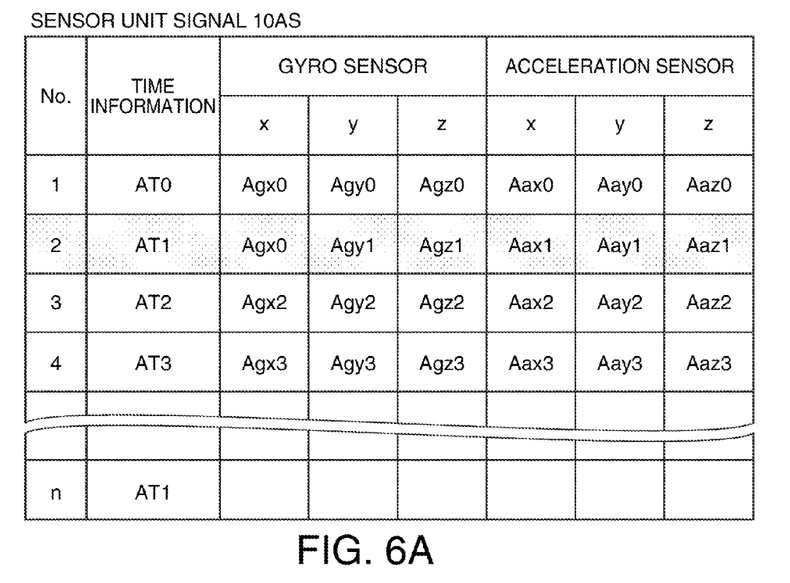
FIGS. 6A and 6B are examples of sensor unit signals to be transmitted to the host terminal in a third embodiment.
Figure 6B:
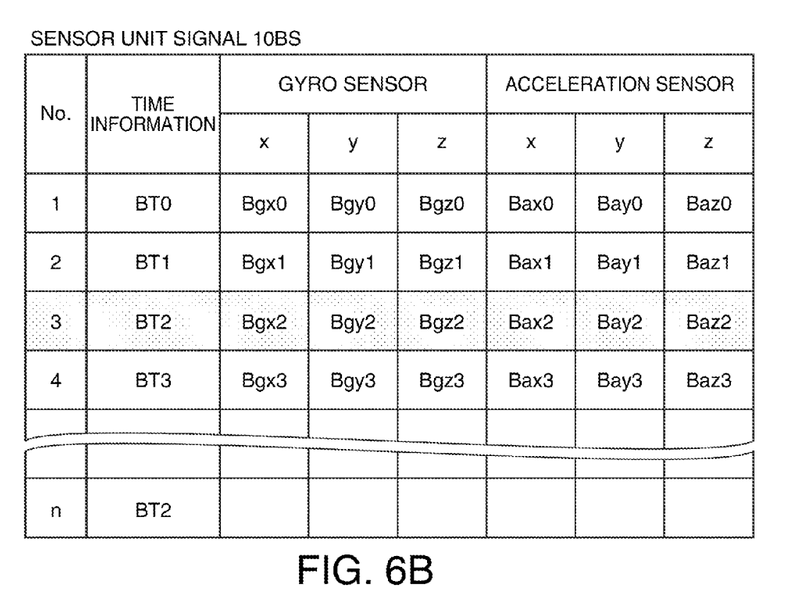

FIG. 6A shows an example of the sensor unit signal 10AS to be transmitted to the host terminal 50 via the communication section 120 of the sensor unit 10A in the third embodiment. FIG. 6B shows an example of the sensor unit signal 10BS to be transmitted to the host terminal 50 via the communication section 120 of the sensor unit 10B in the third embodiment. As shown in FIGS. 6A and 6B, the sensor unit signals 10AS and 10BS of the third embodiment do not include count information as timing information, which is different from the first embodiment.

In FIG. 6A, No. 2 (shaded area) in the sensor unit signal 10AS and No. 3 (shaded area) in the sensor unit signal 10BS show the time point when power feeding to the sensor units 10A and 10B is stopped all together. Then, as shown in FIG. 6A, the data processing section 116 of the sensor unit 10A stores No. 2 time information "AT1" in the memory, sets the stored time information "AT1" in time information of the last (No. n) sensor unit signal 10AS, and transmits the time information to the host terminal 50. As shown in FIG. 6B, the data processing section 116 of the sensor unit 10B stores No. 3 time information "BT2" in the memory, sets the stored time information "BT2" in time information of the last (No. n) sensor unit signal 10BS, and transmits the time information to the host terminal 50.

On the other hand, the synchronization section 504 (refer to FIG. 2) of the third embodiment of the host terminal 50 can synchronize the sensor unit signal 10AS with the sensor unit signal 10BS using the last time information of the sensor unit signal 10AS from the sensor unit 10A and the last time information of the sensor unit signal 10BS from the sensor unit 10B. In the case of examples of FIGS. 6A and 6B, it can be determined, based on the last (No. n) time information "AT1" of the sensor unit signal 10AS and the last (No. n) time information "BT2" of the sensor unit signal 10BS, that the No. 2 time information "AT1" of the sensor unit signal 10AS and the No. 3 time information "BT2" of the sensor unit signal 10BS coincide with each other on the time axis. With reference to the sensor unit signals 10AS and 10BS that coincide with each other on the time axis as described above, it is also possible to synchronize subsequent sensor unit signals 10AS and 10BS with each other.

In the embodiment, the times stored in the respective memories of the sensor units 10A and 10B are transmitted as the last sensor unit signals 10AS and 10BS to the host terminal 50. However, if the synchronization section 504 of the host terminal 50 can determine the sensor unit signals 10AS and 10BS as ones for synchronization, the times may be included, not in the last sensor unit signals 10AS and 10BS, but in the sensor unit signals 10AS and 10BS prior to the last ones, and transmitted.

In the embodiment described above, the time when power feeding from the power feeding apparatus 60 is stopped is stored in the memory of each of the sensor units 10A and 10B, and the stored times are transmitted as timing information. In the host terminal 50, by receiving the times, the respective signal data of the sensor units 10A and 10B are synchronized with each other. The respective times of the sensor units 10A and 10B when power feeding is stopped are used as timing information in this manner, whereby time synchronization can be dealt with easily without adding information for synchronization to the signal data and utilizing time information as time information as it is.

Modified Example 1

In the first embodiment described above, at the time point when power feeding to the sensor units 10A and 10B is stopped all together, the count information as timing information in the sensor unit signals 10AS and 10BS is cleared to 0 to start counting. However, flag information may be disposed as timing information instead of the count information, and at the time point when power feeding to the sensor units 10A and 10B is stopped, a flag may be set in the flag information (for example, "1" is set).

The synchronization section 504 of the host terminal 50 can synchronize the sensor unit signal 10AS with the sensor unit signal 10BS using the flag information of the sensor unit signal 10AS and the flag information of the sensor unit signal 10BS.

Modified Example 2

In the embodiments described above, the power feeding to the sensor units is cut off during measurement. However, power feeding may be cut off before the starting of measurement to thereby reset a count section described below, and count information may be extracted from the count section upon the starting of actual measurement, and put into transmission data. In this case, the count section is desirably disposed separately from the data processing section, and the count is constantly up-dated in the count section. Then, when measurement is started, count information can be acquired from the count section sample by sample and put into the data.

Modified Example 3

In the embodiments described above, timing information is set in the sensor unit signals 10AS and 10BS, and the synchronization section 504 synchronizes the sensor unit signals 10AS and 10BS using the timing information. However, the sensor unit signals 10AS and 10BS may be synchronized with each other without including the timing information in the sensor unit signals 10AS and 10BS. For example, with the time point when power feeding to the sensor units 10A and 10B is stopped all together as a starting point, first sensor unit signals 10AS and 10BS are transmitted to the host terminal 50. In the host terminal 50, it is determined that the first received sensor unit signal 10AS and the first received sensor unit signal 10BS coincide with each other on the time axis, and determination is made also on subsequent sensor unit signals 10AS and 10BS with the first received sensor unit signals 10AS and 10BS as a starting point. That is, in the host terminal 50, motion is analyzed from the time point when power feeding to the sensor units 10A and 10B is stopped.

Modified Example 4

In the embodiments described above, an example of a sensor unit into which two types of inertial sensors, an acceleration sensor and a gyro sensor, are incorporated has been described. However, the types of sensors incorporated into the sensor unit are not limited thereto. For example, any sensors such as an angular velocity sensor, a pressure sensor, an optical sensor, a magnetic sensor, and a temperature sensor may be incorporated into the sensor unit. Moreover, the number of sensor units is not limited to two and may be three or more. Moreover, in the examples of the motion analysis systems in the embodiments, the portion to which the sensor unit is attached is not limited to the shaft of the golf club or the back of the user's hand, and the sensor unit may be attached to any portion associated with motion.

The entire disclosure of Japanese Patent Application No. 2010-234480, filed Oct. 24, 2012 is expressly incorporated by reference herein.

What is claimed is:

1. A sensor system comprising:
a power feeding section that supplies electric power to a plurality of sensors; and
a synchronization section that synchronizes output signals of the plurality of sensors, wherein
the power feeding section includes a power feeding stop part that stops the supply of electric power to the plurality of sensors, and
the synchronization section receives, from the plurality of sensors, timing information indicating when the supply of electric power is stopped by the power feeding stop part, and synchronizes the plurality of sensors using the timing information.

2. The sensor system according to claim 1, wherein
the timing information includes count information that is counted up according to the output signal of the sensor.

3. The sensor system according to claim 2, wherein
an initial value is set in the count information when the supply of electric power is stopped by the power feeding stop part, and
the synchronization section synchronizes the output signals of the plurality of sensors using the initial value of the count information.

4. The sensor system according to claim 1, wherein
the timing information includes time information.

5. The sensor system according to claim 4, wherein
an initial value is set in the time information when the supply of electric power to the plurality of sensors is stopped by the power feeding stop part, and
the synchronization section synchronizes the output signals of the plurality of sensors using the initial value of the time information.

6. The sensor system according to claim 4, wherein
the synchronization section synchronizes the output signals of the plurality of sensors using the time information indicating when the supply of electric power to the plurality of sensors is stopped by the power feeding stop part.

7. The sensor system according to claim 1, wherein
the power feeding stop part is a switch that switches between the starting of power feeding and the stopping of power feeding.

8. A power feeding apparatus comprising a power feeding section that supplies electric power to a plurality of sensors, wherein
the power feeding section includes a power feeding stop part stopping the supply of electric power to the plurality of sensors, receives, from the plurality of sensors, timing information indicating when the supply of electric power is stopped by the power feeding stop part, and transmits the timing information to a synchronization section.

9. A synchronization method comprising:
supplying electric power to a plurality of sensors; and synchronizing the plurality of sensors using timing information indicating when the supply of electric power to the plurality of sensors is stopped.

\* \* \* \* \*